(12) United States Patent
Kato et al.

(10) Patent No.: US 6,724,630 B2
(45) Date of Patent: Apr. 20, 2004

(54) STACKED DEVICE ASSEMBLY

(75) Inventors: Nobuhiro Kato, Tokyo (JP); Masataka Kawai, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/308,071

(22) Filed: Dec. 3, 2002

(65) Prior Publication Data

US 2003/0223198 A1 Dec. 4, 2003

(30) Foreign Application Priority Data

May 28, 2002 (JP) .................................. P2002-153577

(51) Int. Cl.[7] ................................................ H05K 7/20
(52) U.S. Cl. ...................... 361/716; 257/686; 257/777; 361/719; 361/735
(58) Field of Search .................. 257/686, 723, 257/724, 738, 777; 174/16.3; 165/80.3, 185; 361/704, 705, 707–712, 716–719, 735, 790

(56) References Cited

U.S. PATENT DOCUMENTS

| | | | | |
|---|---|---|---|---|
| 5,910,685 A | * | 6/1999 | Watanabe et al. | 257/777 |
| 6,028,352 A | * | 2/2000 | Eide | 257/686 |
| 6,031,727 A | * | 2/2000 | Duesman et al. | |
| 6,461,897 B2 | * | 10/2002 | Lin et al. | 438/109 |
| 6,525,943 B2 | * | 2/2003 | Moden et al. | 361/719 |

FOREIGN PATENT DOCUMENTS

| | | |
|---|---|---|
| JP | 2-125648 | 5/1990 |
| JP | 2-130996 | 5/1990 |
| JP | 6-97355 | 4/1994 |
| JP | 9-283697 | 10/1997 |

OTHER PUBLICATIONS

USPGPUB 2002/0181216 A1, Kledzik, May 6, 2002.*

U.S. patent application Ser. No. 09/947,360, filed Sep. 7, 2001 (Our Ref.: 50006–120).

* cited by examiner

Primary Examiner—G. Tolin
(74) Attorney, Agent, or Firm—McDermott, Will & Emery

(57) ABSTRACT

In order to progress a mounting consistency of electric devices on a substrate, an electronic device assembly, comprising a lower electronic device having electrodes in a surface opposed to the substrate and an upper electronic device having a plurality of the leads each extending from the side surface of own package toward the substrate.

5 Claims, 3 Drawing Sheets

STACKED DEVICE ASSEMBLY

FIELD OF THE INVENTION

The present invention relates to a stacked device assembly. In particular, the present invention relates to a stacked electronic device in which two electronic devices are stacked one on top the other.

BACKGROUND OF THE INVENTION

In order to enhance a mounting density of electronic devices, in particular semiconductor devices on a substrate, there have been proposed a variety of stacking techniques so far. In addition, an idea might have been proposed in which two semiconductor devices are mounted one on top the other while leads of one device do not contact with those of the other. This arrangement can only be realized only when one semiconductor device is larger than the other. However, actually it has been required to stack two devices of substantially the same size. In this instance, if the devices have a flat package from which a plurality of leads are extended from its side and then bent downwardly, a precise arrangement of the devices in which no horizontal shift is made between the devices causes the leads of one device to contact with the leads of the other. The contacts may be prevented by extending a horizontal portion of the leads of the upper device, which in turn results in an increase of the mounted area of the devices.

To overcome this problem, JP 6-97355 (A) discloses another stacked electronic device which is illustrated in FIG. 5 and generally indicated by reference numeral U3. The stacked electronic device U3 has a lower, package type semiconductor device 500 and an upper, package type semiconductor device 600. Packages of those devices 500 and 600 have substantially the same size. Those devices 500 and 600 are stacked one on top the other so that each lead 501, 502 . . . of the lower device 500 is positioned between the adjacent leads 601, 602 . . . of the upper device 600 without any contact therewith. This arrangement does not need the upper leads 601, 602 . . . to extend horizontally and outwardly.

As discussed above, although this arrangement is effective for preventing the enlargement of the upper device, it has another drawbacks which will be described with reference to FIG. 6. As shown, two stacked electronic devices U3 and U4 are mounted on the substrate in a parallel fashion, and spaced L2. Also, leads from one device U3 are opposed to those from the other device U4, leaving a first gap d therebetween defined by a clearance for absorbing dimensional errors caused at the manufacturing of the device and a second gap e, f determined by the horizontal length of the leads.

However, the arrangement needs one leads from the lower device 500 (550) to be positioned between adjacent leads of the upper device 600 (650). This might be done without any difficulty if the lower and the upper devices are the same. Actually, since a great number of flat package type electronic devices with different sizes are available, it is very difficult to identify which electronic device should be combined with which electronic device. Also, the gap between leads of one device should be larger than that of the other, which imposes a considerable restriction on the design of the leads and the device itself.

SUMMARY OF THE INVENTION

Accordingly, an object of the present invention is to provide a stacked electronic device capable of overcoming such restrictions on the lead design and resulting in a variety of functional advantages over the conventional stacked electronic device.

To this end, an electronic device assembly of the present invention, comprising: a lower electronic device to be mounted on a substrate; and an upper electronic device to be provided on or above the lower electronic device, wherein the lower electronic device has a first package, the first package having a lower surface and an upper surface, the lower surface bears a plurality of electrodes so that the electrodes exist within a region defined by the lower surface, wherein the lower electronic device is mounted on the substrate so that the electrodes contact with the substrate; wherein the upper electronic device has a second package and a plurality of leads each extending from the second package toward the substrate, wherein the upper electronic device is provided on or above the lower electrodes while the leads contact with the substrate.

In another aspect of the invention, each electrode has a solder ball.

In another aspect of the invention, each lead of the upper electronic device extends from a side of the second package and then turns toward the substrate.

In another aspect of the invention, the electronic device assembly also comprises a cooling member between the lower and upper electronic devices.

In another aspect of the invention, a substrate having at least two electronic device assemblies each of claim 1, wherein the assemblies are arranged so that each of their leads are positioned between adjacent assembly's leads, in a staggered fashion.

Further features and advantages of the present invention, as well as the structure and operation of various embodiments of the present invention, are described in detail below with reference to the accompanying drawings.

Also, the present application is based upon the Japanese Patent Application No. 2002-153577, the full disclosure of which is incorporated herein by reference.

BRIEF DESCRIPTION OF THE DRAWINGS

The present invention is described with reference to the above accompanying drawings. In the drawings, like reference numbers indicated identical or functional similar elements.

DETAILED DESCRIPTION OF THE PREFERRED EMBODIMENTS

With reference to the drawings, various embodiments of the present invention will be described hereinafter. It should be noted that although terms indicating directions such as "upper" and "lower" are used in the specification and claims for the better understanding of the present invention, the scope of the present invention is not limited by those terms.

First Embodiment

Figure 1:
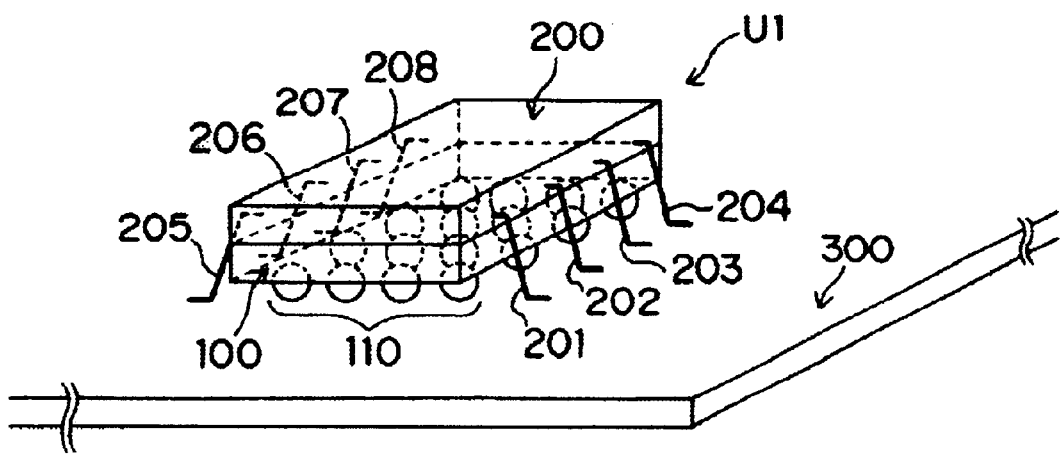
FIG. 1 is a perspective view of a first embodiment of a stacked device assembly according to the present invention.

Referring to FIG. 1, there is shown an electronic device assembly, generally indicated by reference numeral U1. The assembly U1 has a first, lower component or semiconductor device generally indicated by reference numeral 100 and a second, upper component or semiconductor device generally indicated by reference numeral 200. Although the upper and lower devices 100 and 200 are embodied to have a flat package, the present invention is not limited thereto. The lower semiconductor device 100 is directly mounted on a substrate such as circuit board generally indicated by reference numeral 300. The upper semiconductor device 200 is positioned on or above the lower semiconductor device 100. The stacked semiconductor device 100 and 200 are electrically connected with a circuit portions or connection pads formed on the substrate 300. For this purpose, the lower semiconductor device has a number of electrodes 110 on its bottom surface adjacent to the substrate 300 but away from the upper semiconductor device 200. In this embodiment, each electrode 110 is made of a connection pad formed on the bottom surface and a solder ball connected on the connection pad. The upper semiconductor device 200, on the other hand, has a plurality of leads 201–208 each extending over the lower semiconductor device 100 toward the substrate 300. In a case of that the device 100 and 200 are storage devices, e.g., memory modules, the assembly U1 can enhance a storage capacity almost doubly per size. Of course, a length of the leads is determined so that, where the devices 100 and 200 are electrically connected with associated circuit portions or connection pads on the substrate 300, there remains a certain or no gap between the lower and upper semiconductor devices 100 and 200.

Also, in particular, the electrodes 110 are positioned within a plane region outlined by a periphery of the bottom surface of the device 100, which prevents the electrodes 110 from making any physical contact with the leads 201–208 extending over the lower semiconductor device 100. As a result, a horizontal gap between adjacent leads 201–208 can be minimized. Also, each gap may be determined independently.

Although a size of the lower device 100 is substantially the same as that of the upper device 200, they may be different from each other.

Generally, each package of the devices 100 and 200 are made of electrically insulation material. In this instance, the leads 201–208 extending from the upper device 200 may contact with the insulation package of the lower device 100.

Also, a can package or pin-grid-array package may be used for the lower device 100.

In addition, the lower device 100 and the upper device 200 can be electrically connected by some electrodes set within opposing surfaces.

Figure 2:
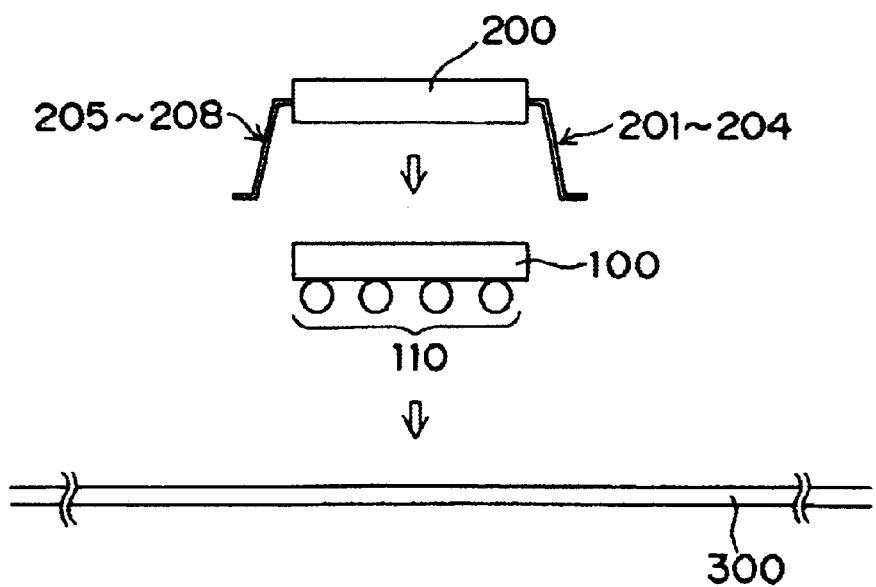
FIG. 2 is an exploded side elevational view of the stacked device assembly in FIG. 1, showing a mounting and assembling of the assembly.

FIG. 2 shows a process for mounting the devices 100 and 200 onto the substrate 300. First, the lower device 100 is mounted in position on the substrate 300 so that the electrodes 110 are placed on associated connection pads formed on the substrate 300. Then, the upper device 200 is mounted on the substrate 300 so that the package of the upper device 200 positions on or above the package of the lower device 100 and the leads 201–208 surround the lower device 100. Preferably, a suitable fixing frame made of heat resistant material is used to prevent a relative displacement between the lower and upper devices 100 and 200, which would otherwise result in a relative displacement between the devices 100 and 200 in the subsequent reflow process. The fixing frame may be designed so that it holds at least opposing four corners of the devices 100 and 200. Alternatively, the displacement can be prevented by a temporal fixing or soldering of the solder balls and the leads. Instead, the displacement can be prevented by convex portions and concave portions engaging with the convex portions made on the opposing surfaces of the lower and upper devices, respectively. Those improvements are preferably used if any displacement between the devices is expected to occur in the reflow process.

The substrate 300 with the devices 100 and 200 is then transported into the reflow process where the devices 100 and 200 are permanently secured on the substrate 300. Preferably, the devices 100 and 200 are subject to only one reflow process, which would otherwise deteriorate another electronic devices already mounted on the substrate.

Second Embodiment

Figure 3:
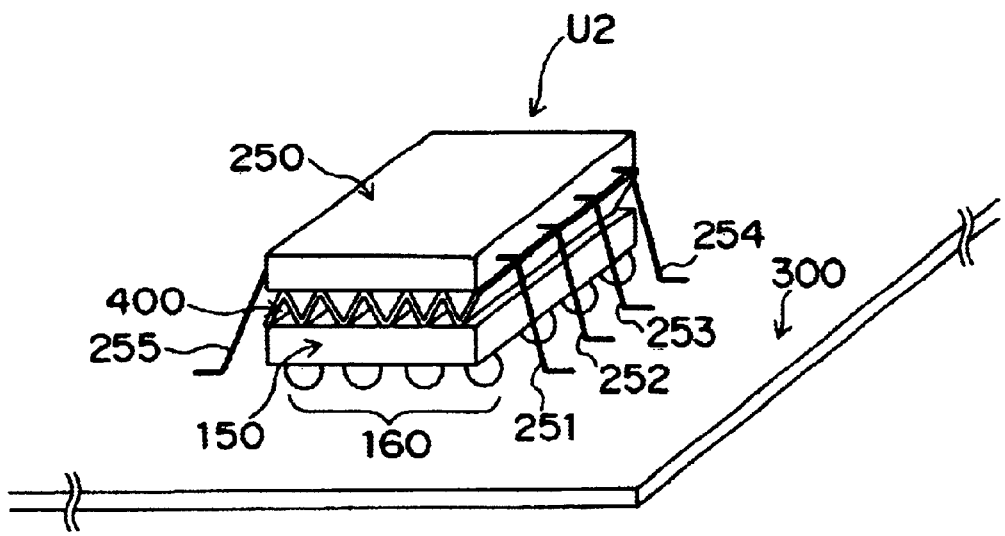
FIG. 3 is a perspective view of a second embodiment of a stacked device assembly according to the present invention.

FIG. 3 shows a second embodiment of another electronic device assembly, generally indicated by reference numeral U2. Like first embodiment, the assembly U2 has a lower semiconductor device 150 and an upper semiconductor device 250 mounted on the lower device 150. Also, the lower semiconductor device 150 bears a number of electrodes or solder balls 160 on a bottom surface facing the substrate 300. The upper semiconductor device 250 has a plurality of leads 251–258 extending downward from its package toward the substrate 300. In particular, a cooling member 400 is provided between the lower and upper devices 100 and 200 in order to dissipate heat generated in the devices 150 and 250. As shown in the drawing, the cooling member 400 may be a corrugated plate or another plate with a number of fins or ribs. Instead, the cooling member 400 may be a fan which is driven by, for example, a suitable small motor. Alternatively, the cooling member 400 may be a water cooling device. In this instance, a tube should be arranged on the substrate for the transportation of cooling medium. With the arrangement, heat generated at the devices 100 and 200 is well dissipated therefrom to the atmosphere. Also, the cooling member 400 is effective where either or both of the devices 100 and 200 have less heat durability.

The device assembly U2 is manufactured by stacking the lower device 100, the cooling member 400 and then mounting the upper device 200 in this order. Preferably, the stacked devices are then held by a suitable frame to prevent a relative displacement which may otherwise occur in the subsequent reflow process.

A suitable assembly of this embodiment may be an electronic component for use in a portable communication device such as mobile phone and personal digital assistant, for example. In this instance, a buffer memory is used for the lower device 150 and a PLL chip is used for the upper device 250.

Figure 4:
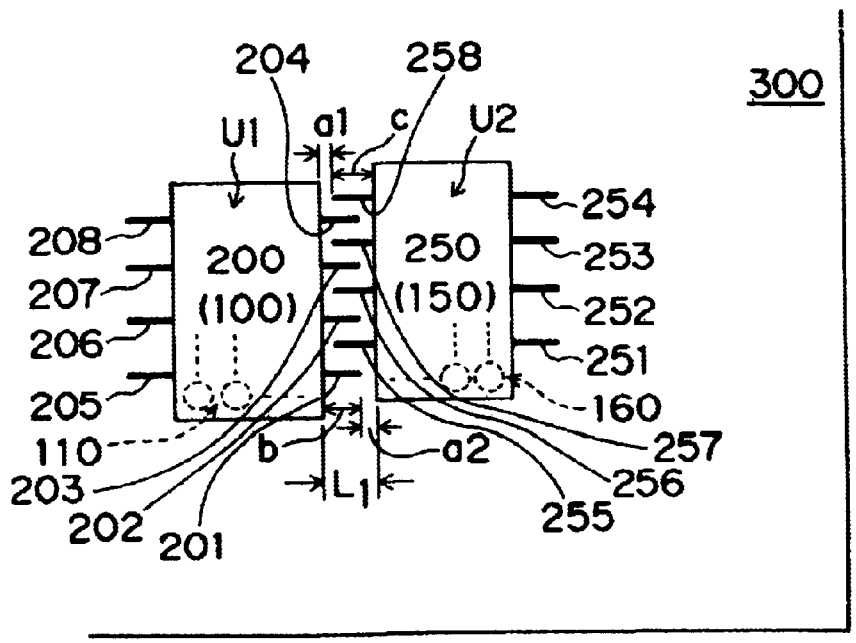
FIG. 4 is a plan view of two device assemblies mounted on the substrate.

FIG. 4 shows an arrangement of the device assemblies U1 and U2 on the substrate 300. As shown in the drawing, two neighboring assemblies U1 and U2 can be arranged so that each of the leads 201, 202, 203 and 204 of one assembly U1 positions between adjacent leads 255, 256, 257 and 258 of the other assembly U2, i.e., in a staggered fashion. Also, since the solder balls 110 and 160 of the lower devices 100 and 150 are limited within the region outlined by the periphery of the bottom surface of the device 100 and 150, each horizontal gap between the neighboring leads 201–208 and 251–258 can be determined without any restriction, which eases the above staggered arrangement of the leads 201, 202, 203, 204, 255, 256, 257 and 258. This in turn reduces an area occupied by one assembly and, as a result, allows a high density mounting of the assemblies U1 and U2. In this instance, a distance L1 defined between the neighboring assemblies U1 and U2 can be determined by a gap a1 (a2) between the lead of one assembly and the opposing periphery of another assembly and a horizontal length of the lead c (b). The gap a1 (a2) may be determined, for example, by dimensional errors which might occur at the manufacturing of the device 200, 250 and leads 201–208, 251–258 and/or by an insulation gap which is required for an electrical insulation between the leads 201–208, 251–258 and the electrodes 110, 160. If the solder balls 110 (160) of one assembly 100 (150) are positioned away enough from the leads 255, 256, 257 and 258 (201, 202, 203 and 204) of the other assembly U2 (U1), the gap a1 (a2) may be far reduced and a distal end of the leads 255, 256, 257 and 258 (201, 202, 203 and 204) of the other assembly U2 (U1) may be positioned within the region outlined by one assembly U1 (U2).

Figure 5:
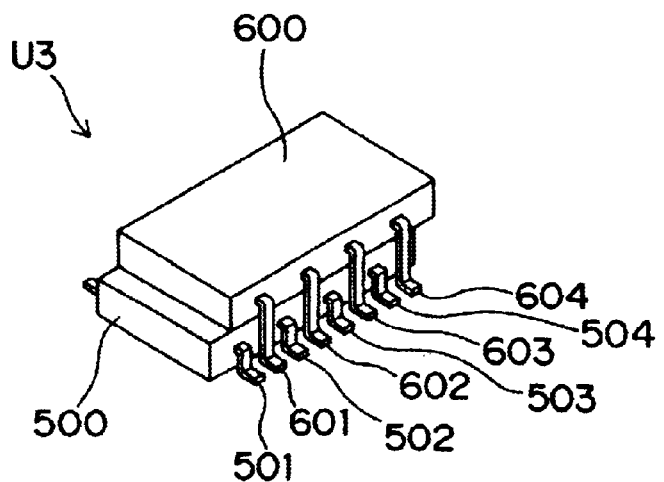
FIG. 5 is a perspective view of a conventional stacked device assembly.
Figure 6:
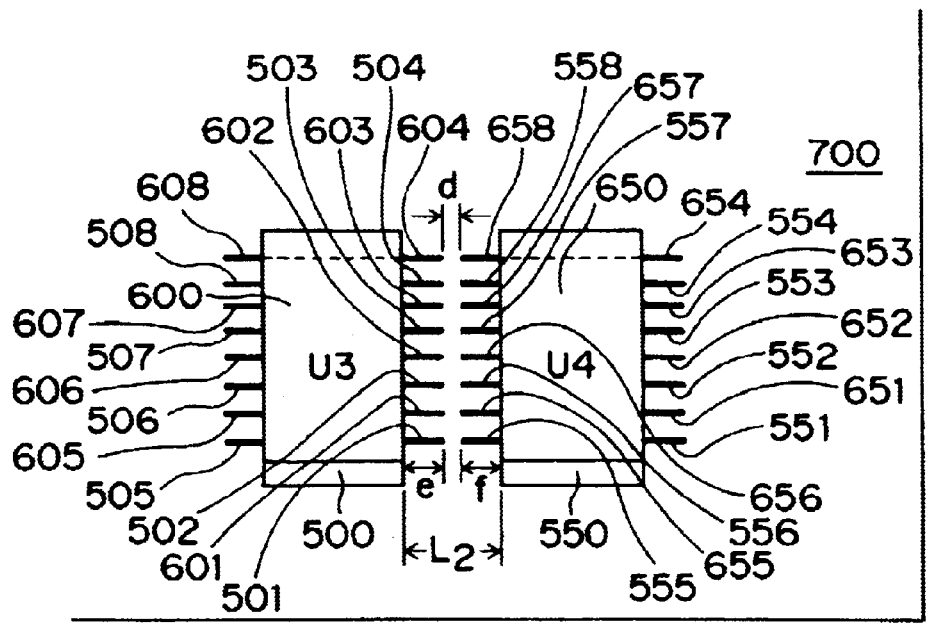
FIG. 6 is a plan view of two conventional device assemblies mounted on the substrate.

As described above, according to the stacked device assembly U1 and U2, the horizontal gap between the adjacent assemblies U1 and U2 can be reduced considerably when compared with the conventional stacked device assembly U3 and U4 shown in FIGS. 5 and 6, which enhances a mounting density of the devices on the substrate.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An electronic device assembly, comprising:
   a lower electronic device to be mounted on a substrate; and
   an upper electronic device to be provided on or above the lower electronic device,
   wherein the lower electronic device has a first package, the first package having a lower surface and an upper surface, the lower surface bears a plurality of electrodes so that the electrodes exist within a region defined by the lower surface, wherein the lower electronic device is mounted on the substrate so that the electrodes contact with the substrate;
   wherein the upper electronic device has a second package and a plurality of leads each extending from the second package toward the substrate, wherein the upper electronic device is provided on or above the lower electrodes while the leads contact with the substrate.

2. The electronic device assembly of claim 1, wherein each electrode has a solder ball.

3. The electronic device assembly of claim 1, wherein each lead of the upper electronic device extends from a side of the second package and then turns toward the substrate.

4. The electronic device assembly of claim 1, further comprises a cooling member between the lower and upper electronic devices.

5. A substrate having at least two electronic device assemblies each of claim 1, wherein the assemblies are arranged so that each of their leads are positioned between adjacent assembly's leads, in a staggered fashion.

* * * * *